United States Patent [19]

Haglund

[11] 4,143,763

[45] Mar. 13, 1979

[54] COLLAPSIBLE SHIPPING CONTAINER FOR CIRCUIT BOARDS

[75] Inventor: James E. Haglund, Minneapolis, Minn.

[73] Assignee: Central Container Corporation, Minneapolis, Minn.

[21] Appl. No.: 858,097

[22] Filed: Dec. 7, 1977

[51] Int. Cl.² .................... B65D 81/16; B65D 85/62
[52] U.S. Cl. .................................. 206/334; 206/454; 206/564; 211/41; 229/15
[58] Field of Search ............... 206/334, 328, 454, 456, 206/455, 564, 561; 229/15, 28 A, 39 B, 41 B, 41 R, 39 B; 217/29; 211/40, 41

[56] References Cited
U.S. PATENT DOCUMENTS

| 1,428,019 | 9/1922 | Fairchild | 217/29 |
| 1,956,458 | 4/1934 | Watson | 229/15 |
| 3,536,246 | 10/1970 | Rosen | 229/15 |
| 3,554,429 | 1/1971 | Cohen | 206/456 |
| 3,596,758 | 8/1971 | Phillips, Jr. et al. | 229/28 R |
| 3,915,307 | 10/1975 | Agarde | 206/328 |

Primary Examiner—William T. Dixson, Jr.
Attorney, Agent, or Firm—H. Dale Palmatier

[57] ABSTRACT

A shipping container for circuit boards and similar types of panels having a box and a cover, both formed of corrugated cardboard with bottom flaps extending entirely across the bottom of the container, the corrugations in the end walls oriented vertically, plastic panels secured on the inner sidewalls of the box and defining horizontal ribs and also plateau areas to bear against the side edges of the circuit boards, there also being vertical ribs projecting from the plateau areas to define grooves receiving the edges of the circuit boards; the ribs and grooves in opposite panels on the sidewalls nesting together when the box is collapsed and the end walls flexing to accommodate complete nesting of the ribs and grooves of the plastic panels.

11 Claims, 8 Drawing Figures

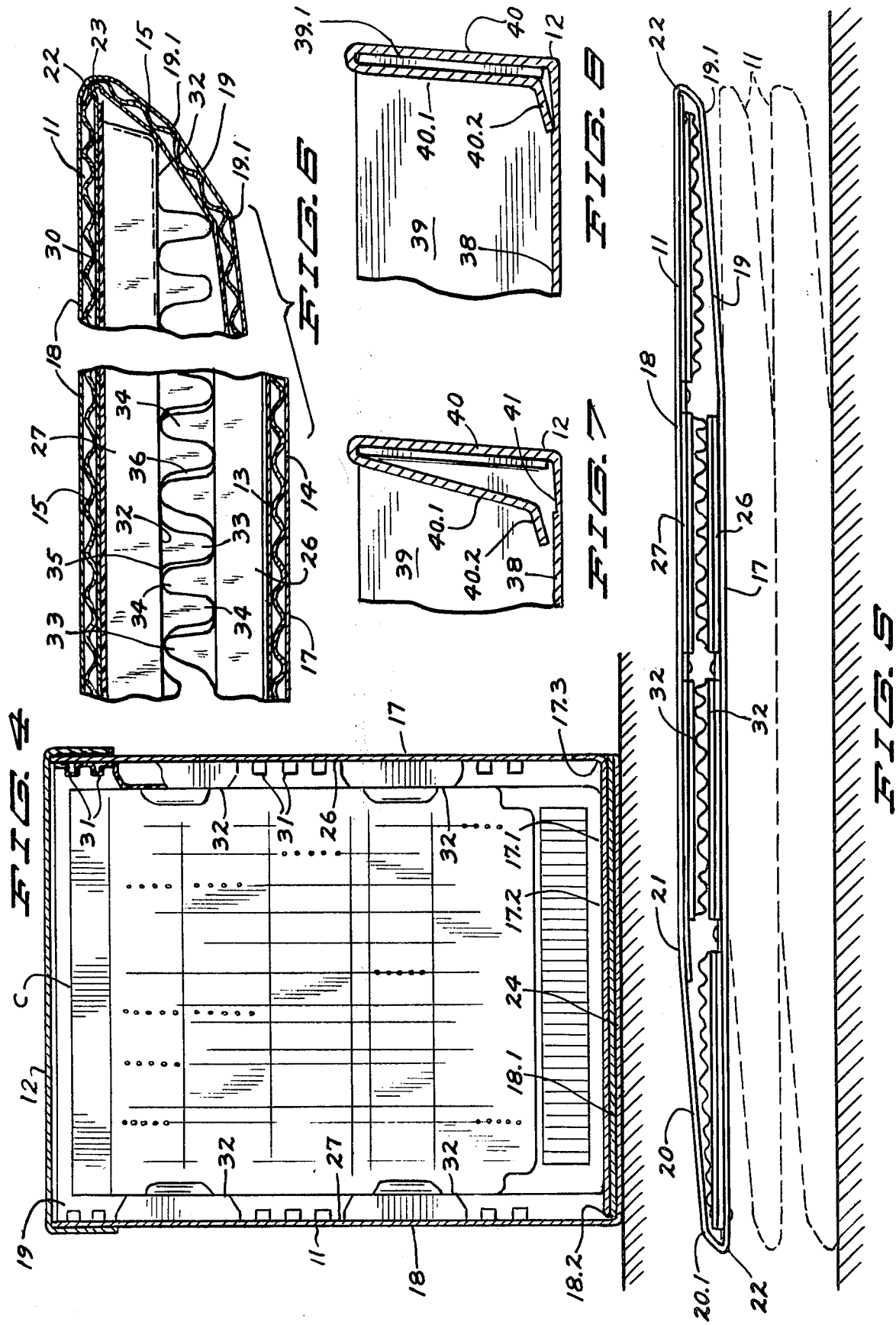

COLLAPSIBLE SHIPPING CONTAINER FOR CIRCUIT BOARDS

This invention relates to collapsible and reusable shipping boxes incorporating interior spacer and retainer panels for holding circuit boards and similar panels.

BACKGROUND OF THE INVENTION

Circuit boards may carry printed circuits and may have various circuit components mounted thereon. Such circuit boards are often transported to assembly plants or stations so that they may be incorporated into other equipment.

Previously, inexpensive and reusable shipping boxes for circuit boards and similar type panels have not been known and readily available commercially.

SUMMARY OF THE INVENTION

The collapsible and reusable shipping boxes herein disclosed adequately carry and protect circuit boards during transport of such boards; and subsequently, the shipping boxes are easily knocked down into small compass to be returned to the point of origin for reuse in shipping additional circuit boards or similar panels.

The shipping boxes have interior spacers which retain the individual circuit boards in spaced relation with respect to other boards so as to prevent one board from engaging and damaging the next adjacent board in the box. The box is made of corrugated cardboard which is conventionally made with the inner and outer liners of the box being formed of kraft board. In some instances, it may be desirable to apply a thin plastic laminate to the inner liner of the corrugated cardboard.

The bottom of the box has a single flap extending entirely across the width of the bottom to provide a planar surface upon which the circuit boards are supported. The two smaller end flaps underlie the full width side flap, and are superposed over the other full width side flap which forms the outside bottom of the box. The cardboard forming the box is appropriately scored for causing the bottom flaps to fold at the proper location so that each lies flat when assembled.

The bottom flaps of the box may be taped in closed condition as described, but may also swing downwardly by removal or cutting of the tape so that the bottom of the box is open and unobstructed and adapted for folding into flattened condition.

A pair of plastic insert panels are secured to the opposite sidewalls of the box and define vertically oriented rib-like projections defining a number of vertical slots or grooves in which the edges of the circuit boards are confined. These insert panels are formed of plastic sheet material which is substantially rigid, but has sufficient resilient flexibility as to accommodate some variations in the sizes of the panels and as to provide cushioning for the circuit boards at the sidewalls of the box. The insert panels have broad plateau areas which are spaced from the cardboard sidewalls of the box and upon which the rib-like projections are defined so that the side edges of the circuit boards are held significantly away from the cardboard sidewall of the box.

The insert panels also define numerous horizontally extending ribs which strengthen the sidewalls of the box and minimize flexing thereof.

At the ends of the sidewalls, the cardboard in the box is scored so that the corners of the box are sharply defined. In order to accommodate collapsing of the box into closed condition it is highly preferable that the corrugated cardboard in the end walls of the box be oriented so that the corrugations extend along or vertically relative to the upright corner at the end of the sidewall. The end wall may thereby flex slightly as it engages the endmost portion of the plastic insert panels on the inner sides of the sidewalls.

The rib-like projections of the insert panels on opposite sidewalls of the box mesh together so that all of the projections are received in grooves of the opposite panel. In order to assure complete meshing of the projections of the insert panels into the opposite slots or grooves, the bowing or flexing of the end walls adjacent the corners will occur as to accommodate the complete meshing of the projections together. Such flexing of the end walls adjacent the corners allows slight endwise displacement of the sidewalls relative to each other as the box is collapsed. The relative displacement of the sidewalls allows the most complete meshing of the ribs and grooves so as to make the collapsed box as thin as possible. Numerous arrangements of the rib-like projections is possible to accommodate the full and complete meshing of these projections into the slots of the opposite panels.

DESCRIPTION OF THE DRAWINGS

FIG. 4 is a detail section view taken approximately at 4—4 in FIG. 2.

FIG. 5 is an elevation view showing a box in collapsed condition and showing the manner of stacking thereof with other similar boxes.

FIG. 6 is an enlarged detail section view of the box in collapsed condition with portions broken away in order to show the salient portions in enlarged detail.

FIGS. 7 and 8 are detail section views through the end of the cover and illustrating the manner of clinching of the end flaps.

DETAILED SPECIFICATION

Figure 1:
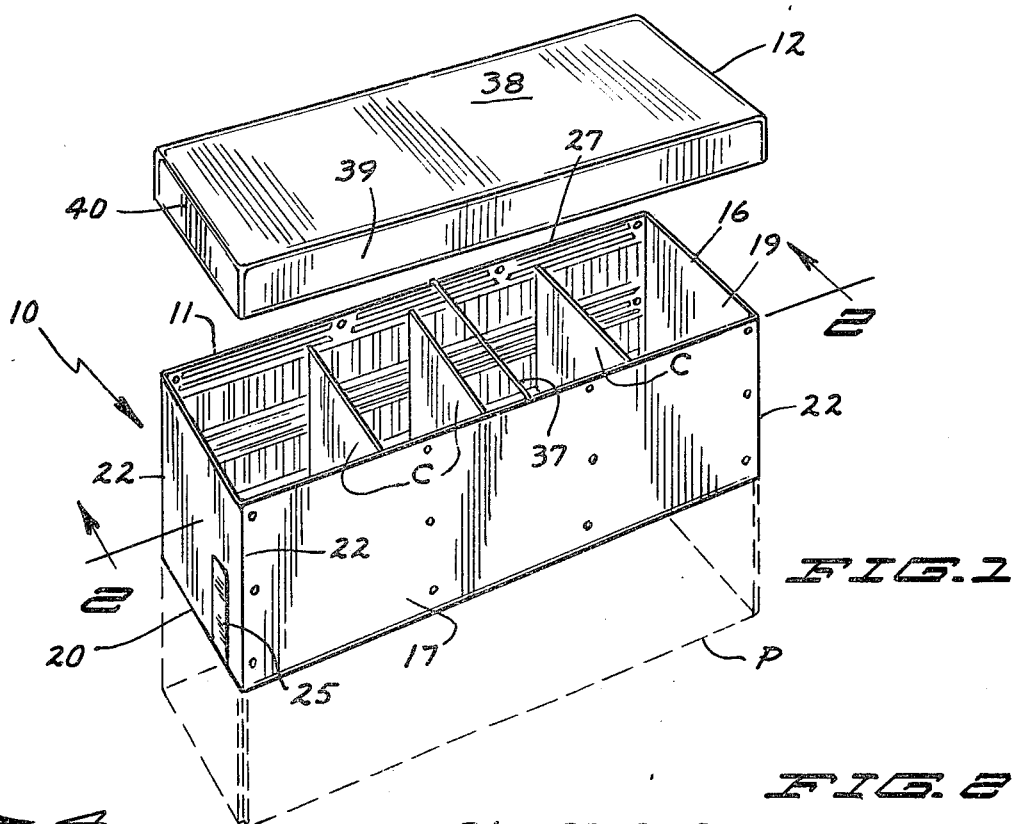
FIG. 1 is a perspective view of the shipping box.

One form of the invention is shown in the drawings and is described herein. The shipping container 10 includes a box 11 and a cover 12, both formed of corrugated cardboard. The cardboard material used in both the box 11 and cover 12 may be any of a number of different types of cardboard, but one typical material would be 275 pound B flute corrugated cardboard with a kraft inner liner 13 and a kraft outer liner 14 which may be partially bleached. The corrugated cardboard in the box is oriented so that the intermediate corrugated kraft lamina 15 is arranged with the corrugations 15 extending vertically such that the corrugations are readily visible in the upper peripheral edge 16 of the box.

The box 11 has sidewalls 17 and 18 and end walls 19 and 20. All of the sidewalls and end walls 17–20 are preferably formed of one single piece of material which is lapped and riveted to itself at a joint 21. At each of the corners 22 a single score line 23 is formed at the inner liner 13 so that the cardboard will crease sharply at the corners. It is important to note that the corrugations in the intermediate corrugated laminae 15 lie parallel to the score lines 23 at the corners.

The box 11 also has a bottom which is indicated in general by numeral 24 and is formed of a number of thicknesses of the corrugated cardboard. The bottom 24 is formed with a full width flap 17.1 formed integrally of the sidewall 17 and extending across the full width of the box interior into close proximity with the sidewall 18. This flap 17 defines a planar surface 17.2 upon which the circuit boards C are supported. The sidewall 17 has a score line at 17.3 to assure that a sharp bend will exist at the joint of flap 17.1.

The bottom 24 also includes a pair of end flaps 19.1 and 20.1 respectively formed integrally of the end walls 19 and 20 are turned inwardly in underlying relation with the full width flap 17.1.

The bottom 24 also includes a second full width flap 18.1 formed integrally of the sidewall 18. Score lines 19.2 and 20.2 are provided at the lower edges of end walls 19 and 20 so that the inturned bottom flaps 19.1 and 20.1 are located at a level slightly lower than the full width side flap 17.1. Similarly, the lower edge of sidewall 18 has a score line at 18.2 so that the lowermost full width flap 18.1 in the bottom 24 is properly located at a level below both end flaps 19.1 and below the full width side flap 17.1, as to form the exterior bottom of the bottom wall 24.

Figure 2:
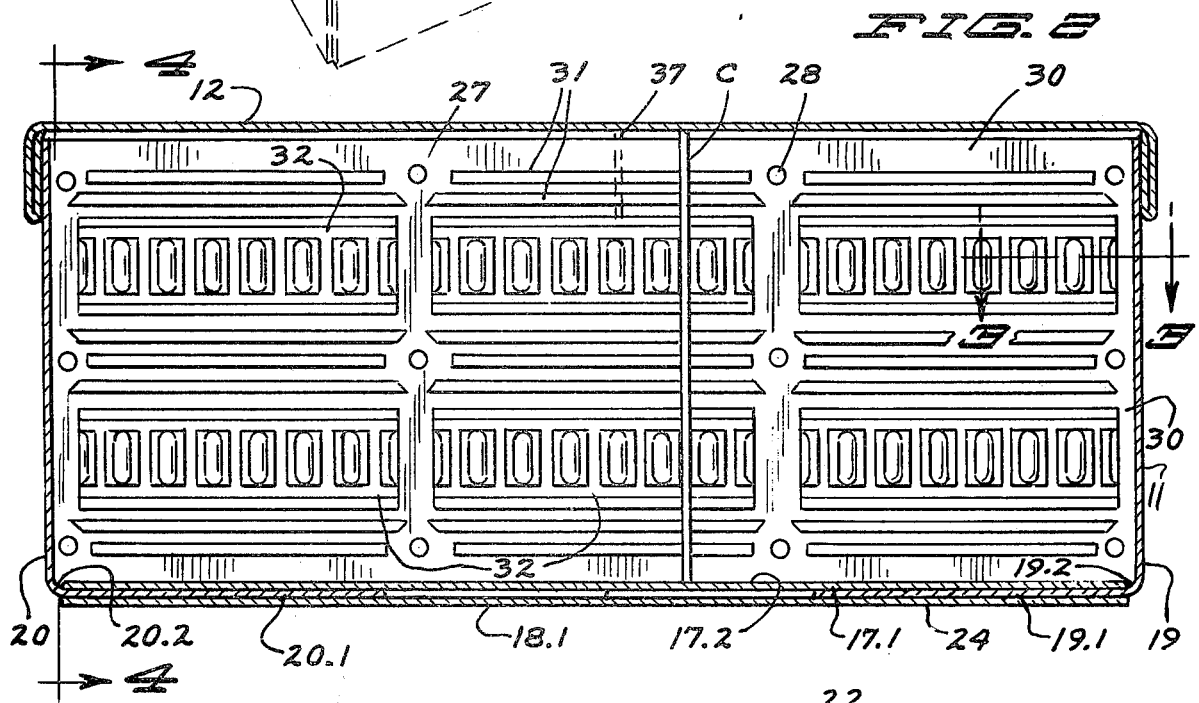
FIG. 2 is an enlarged detail section view, taken on a vertical plane, as indicated at 2—2 in FIG. 1, and showing the lid of the box assembled onto the box.

When the box is in distended condition as illustrated in FIG. 1, a length of tape 25 is adhesively applied to the box to retain the bottom flaps in the positions indicated in FIGS. 2 and 4.

The box 11 is provided with a pair of plastic insert panels 26 and 27 which are substantially identical to each other and which are respectively fixed as by rivets 28 to the cardboard sidewalls 17 and 18. The plastic insert panels 26 and 27 are formed of relatively stiff, but resiliently flexible plastic material such as high density polystyrene of a thickness of approximately 0.020 inches, or a low static polyethylene with a thickness of 0.040 inches. Of course, other plastics of various natures may be used, but these have been found to be satisfactory.

Each of these panels 26 and 27 has a base area 30 which lies flush against the inner liner 13 of the sidewall and is held flush against the sidewall by the fastening rivets 28. The base area extends around the entire periphery of each of the panels and it will be noted that the base area extends into close proximity with the corners 22 so that the panels will cover substantially the entire length and breadth of the sidewalls 17 and 18.

Each of the panels has a plurality of elongate and horizontally extending ribs 31 which are slightly raised from the base area 30. In the particular panels 26 and 27 illustrated, the ribs 31 are discontinuous so that the same panels 26 and 27, if used in other boxes of different sizes, can be cut and made to fit the appropriate size of box.

Each of the panels 26 and 27 also has a plurality of raised plateau areas 32. In the particular panels 26 and 27 illustrated, the plateaus 32 are elongate and extend generally horizontally along the length of the panels; and there are plateaus 32 adjacent both the upper portions and lower portions of the sidewalls. The plateaus 32 are also discontinuous in a fashion similar to the ribs 31 to adapt the particular panels 26 and 27 to fit boxes of other sizes, simply by cutting the panels to shortened lengths.

The plateaus 32 have a height from the sidewalls 17 and 18 of the box which is substantially greater than the corresponding height or thickness of ribs 31 so that the ribs 31 will not engage or interfere with the side edges of the circuit boards C, but the side edges of the boards will engage and bear firmly against the faces of the plateaus 32. The plateaus 32 may flex slightly under pressure from the edges of the circuit boards C as to accommodate circuit boards of slightly different size and also as to provide some significant cushioning for the circuit boards in the event physical shock is experienced during shipping.

The panels 26 and 27 are also provided with a plurality of elongate and vertically oriented ribs 33 and 34 which are variously shaped and variously spaced from each other as to define grooves 35 and 36 of different widths. The variously sized grooves 35 and 36 are adapted to accommodate circuit boards of various thicknesses or boards that may have components of significant dimensions close to their side edges.

It will be recognized that the ribs 33 and 34, and the grooves 35 and 36 are formed in a regular, repeated pattern, and the ribs and grooves are formed identically on both of the panels 26 and 27.

It will also be recognized that other sizes and spacings of the ribs may more suitable and other insert panels to accommodate circuit boards and other rigid panels of varying sizes and thicknesses.

In any event, the ribs 33 and 34 retain and hold the circuit boards C in upright position and minimize any movement of the circuit boards relative to the box 11.

A rigid wire or rod type strut 37 spans the top edges of the sidewalls 17 and 18 and has downwardly turned ends which extend between the corrugations of the inner lamina 15 and between the inner and outer laminae 13 and 14.

The cover 12 of the box has a top panel 38, side panels 39, end panels 40, flaps 39.1 and 40.1, respectively, formed integrally of the side panels and end panels. The end flap 40 has a lip 40.2 on its inner end to fit into and lie in a recess 41 formed by cutting into the inner liner of the corrugated cardboard.

In operation, the box when distended and having the bottom 24 taped into closed condition, is well suited to the transport and storage of the circuit boards C. Many of the elements carried on the circuit boards are extremely sensitive and the box 11 adequately protects these sensitive elements that may be on the circuit board. It may be desirable in some instances to provide a plastic laminate on the inner kraft lamina 13 of the corrugated cardboard as to minimize dust and static or electrical charges that might otherwise adversely affect the sensitive elements carried on the boards.

The cover 12 also holds the circuit boards in their proper position in the interior of the box. Any physical shock that occurs to the container during shipment or handling, will be absorbed by the resilient flexing of the plateau areas 32 of the insert panels so that the circuit boards C are well protected against such physical shock.

After the circuit boards have been delivered to their destination, the boxes may be collapsed into small compass to be returned to their point of origin for carrying another shipment of circuit boards. The bottom flaps will be loosened by removing or cutting the tape 25 so that the flaps may be swung downwardly into the dotted line position P illustrated in FIG. 1. When the bottom flaps have been swung down in this manner, the box may be collapsed by swinging the side and end walls relative to each other into the position illustrated in FIG. 5 so that a number of boxes may be stacked onto each other as to occupy a minimum of space for shipping to the point of origin. When the boxes 11 are collapsed into the condition illustrated in FIG. 5, the two sidewalls move into close proximity with each other. The grooves 35 and 36 of both of the panels 26 and 27 receive the ribs 33 and 34 of the opposite panel so that all of the ribs and grooves of the several panels are meshed together substantially in the manner illustrated in FIG. 6. It will be noted that the grooves are of significant width so that ribs may be accommodated to substantially the full depth of the grooves so as to absolutely minimize the space occupied by the combined thicknesses of the sidewalls 17 and 18 and the panels 26 and 27. The top edges of the ribs 33 and 34 actually come to the level of the plateau 32 of the opposite panel.

Figure 3:
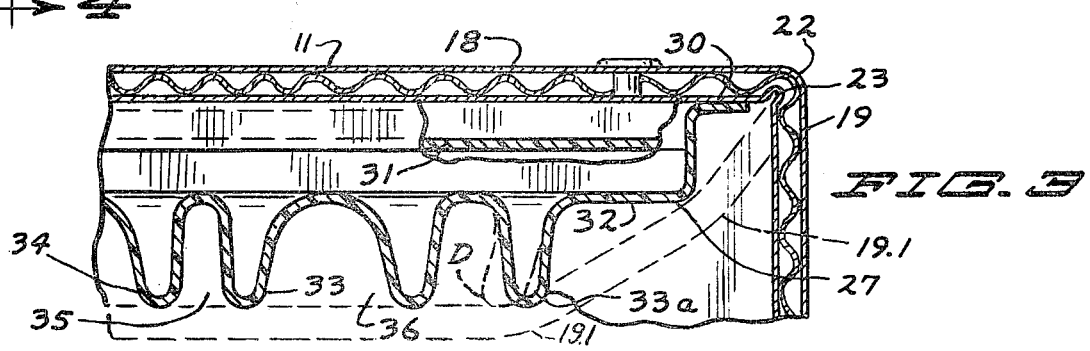
FIG. 3 is an enlarged detail section view taken approximately at 3—3 in FIG. 1.

In order to allow such complete meshing of the ribs and grooves of the panels 26 and 27, of course the ribs and grooves must be in substantially precise alignment. In order that the ribs and grooves of opposite panels can be precisely aligned for maximum meshing or nesting, the end walls 19 and 20 of the box are swung at the corners 22 into sharp acute angled relation with the sidewalls 17 and 18. The score lines 23 permit the sharp bending of the end walls at the corners. Additionally, the end walls 19 and 20 bend at 19.1 and 20.1 to traverse the end of the plateau areas 32 and the ribs protruding therefrom, and of course the end walls then lie nearly parallel to the sidewalls in this collapsed condition. The orientation of the corrugations in the intermediate lamina kraft laminae 15 facilitate the bending of the end walls at 19.1 and 20.1. As illustrated in FIG. 3, the first rib, 33a, next adjacent the end of the plateau 32, may be engaged by the adjacent end wall of the box and flexed thereby as into the dotted line position D illustrated in FIG. 3. As soon as the pressure by the end wall is relieved, the endmost rib 33a will return to its normal position because of the resilient nature of the plastic material in the panel.

It is very important to note that the additional bending at 19.1 and 20.1 of the end walls, in addition to the sharp angled flexing at the corners 22, contributes materially to the proper aligning of the several ribs 33 and 34 with the grooves 35 and 36 of the opposite panel so that maximum meshing or nesting of the ribs and grooves will occur while the box is in the collapsed condition. In this way, the box can be made to occupy a minimal amount of space during return shipment of the collapsed box to the point of origin for shipping another load of circuit boards C.

Of course, the cover 12 may also be collapsed by loosening the flaps 40.2 and 40.1, whereupon all of the sidewalls and end walls 39 and 40 may be simply laid flat with the central portion 38 of the cover. The covers 12 may then be returned to point of origin along with the collapsed boxes.

Of course, when the collapsed boxes reach the point of origin and an additional quantity of circuit boards is to be stored for shipment, the box may be readily returned to its distended condition, simply by opening the box up and closing the bottom flaps to form the bottom 24 in the manner described. It is important to note that when the box is returned to its distended condition, the additional bending at 19.1 and 20.1 of the end walls has no adverse effect on the box in its normal and intended use during shipment of circuit boards.

It will be seen that I have provided a new and improved collapsible shipping box for circuit boards with plastic insert panels on the inner sidewalls with plateau areas and horizontally extending ribs, and a plurality of vertical ribs and grooves to accommodate the edges of the circuit boards. The end walls may easily flex when the box is collapsed so as to obtain maximum nesting or meshing of the ribs and grooves in the plastic panels.

What is claimed is:

1. A shipping box for rigid circuit boards, comprising a corrugated cardboard box having upright sidewalls confronting each other and end walls adjoining the sidewalls at the corners of the box, the box also having a bottom formed of inturned flaps attached to the sidewalls and end walls and completely enclosing the bottom of the box interior, a pair of plastic insert panels in the box and respectively affixed to the opposite sidewalls, the panels having base areas lying flush against the box sidewalls and also having raised plateau areas spaced from the box sidewalls to bear against and cushion the circuit board edges, the plateau areas extending along the sidewalls of the box and into close proximity with the end walls, the plateau areas being bounded by the base areas adjacent the end walls, and the panels also having a plurality of elongate and vertically oriented ribs in spaced and side by side relation on the plateau areas and defining grooves therebetween to receive and retain the edges of the circuit boards therebetween, the ribs and plateau areas of the opposite panels confronting and engaging each other when the inturned flaps are swung downwardly and the box is collapsed with the sidewalls swung adjacent each other.

2. The shipping box according to claim 1 and the end walls of the box bending in spaced relation to the corners as the box is collapsed and traversing the adjacent plateau areas and ribs to lie along panel in close relation.

3. The shipping box according to claim 1, and the grooves on each of the insert panels receiving the ribs of the opposite panel in meshing relation for collapsing the sidewalls of the box into minimal thickness.

4. The shipping box according to claim 2, and the end walls of the box bending in spaced relation to the corners as the box is collapsed to accommodate relative endwise movement of the sidewalls for meshing the ribs and grooves.

5. The shipping box according to claim 4, and the end walls of the box having the corrugations oriented vertically and thereby minimize resistance in the end walls to such bending.

6. The shipping box according to claim 1, and the plateau areas of the insert panels being elongate and extending longitudinally of and horizontally along the sidewalls, the plateau areas having a width in a vertical direction which is substantially less than the height of the sidewalls.

7. The shipping box according to claim 6, and the insert panels also including a plurality of elongate horizontal ribs lying along the plateau areas and having widths substantially less than the widths of the plateau areas.

8. The shipping box according to claim 6, and each of the panels having a pair of plateau areas in juxtaposed relation to each other, and one above the other.

9. The shipping box according to claim 1, and the bottom of the box including a flap formed integrally of one of the sidewalls and extending across the entire width of the box and providing a substantially planar upper surface upon which the circuit boards are supported.

10. The shipping box according to claim 7, and the plateau areas having significantly greater depth from the cardboard sidewalls of the box than the ribs whereby only the plateau areas will engage the side edges of the circuit boards.

11. A shipping box for rigid circuit boards, comprising a corrugated cardboard box having upright sidewalls confronting each other and end walls adjoining the sidewalls at the corners of the box, the corners of the box being provided with vertical score lines to provide for sharp bending of the box at the corners, the end walls of the corrugated cardboard box having vertically oriented corrugations extending parallel to the corners and the score lines therein, the box also having a bottom formed of inturned flaps attached to the sidewalls and end walls and completely enclosing the bottom of the box interior, one of said inturned flaps being attached to one of the sidewalls extending entirely across the width of the box and providing a substantially planar upper surface upon which such circuit boards are supported, the inturned flaps attached to the end walls underlying said full width flap defining the planar upper surface, and the remaining inturned flap secured to the other sidewalls underlying the flaps attached to the end walls, a pair of plastic insert panels in the box and respectively affixed to the opposite sidewalls, said panels being formed of stiff, but slightly resiliently flexible plastic material, the panels having base areas lying flush against the box sidewalls and extending entirely along the corners between the sidewalls and end walls, the panels also having raised plateau areas spaced from the box sidewalls to bear against and cushion the circuit board edges and to flex slightly toward the box sidewalls under influence of the edges of the circuit boards, the plateau areas extending along the sidewalls of the box and substantially horizontally into close proximity with the end walls, the panels also having a plurality of elongate and vertically oriented retainer ribs in spaced and side-to-side relation on the plateau areas defining grooves therebetween of various widths to receive and retain the edges of the circuit boards, the grooves being significantly wider than the ribs as to receive the ribs of the opposite panels in meshing relation for collapsing the sidewalls of the box into minimal thickness, the insert panels also having a plurality of elongate horizontal ribs lying along the plateau areas and having a thickness in a direction outwardly from the box sidewall significantly less than the thickness of the plateau areas in the same direction to be continuously spaced from the side edges of the circuit boards, the plateau areas having a width in a vertical direction which is substantially less than the height of the sidewalls, the end walls of the box bending in spaced relation to the corners as the box is collapsed, the end wall of the box between the score line at the corner and the bend in the end wall traversing the end portions of the adjacent plateau areas and allowing the end wall to lie along the insert panel when the box is in collapsed condition, the bend in the end walls of the box accommodating limited relative endwise movement of the sidewalls of the box in order to allow the meshing ribs and grooves to position themselves relative to each other for complete meshing in order that the box in collapsed condition has minimal thickness, and a removable rod strut spanning the width of the box adjacent the top edges of the sidewalls and being secured to the sidewalls to limit outward bowing of the sidewalls while the circuit boards are carried in the box, and a cover for the box having a depending edge to embrace the upper periphery of the box.

* * * * *